United States Patent [19]

Kaneko

[11] Patent Number: 4,581,717
[45] Date of Patent: Apr. 8, 1986

[54] THERMOMAGNETIC RECORDING METHOD

[75] Inventor: Masahiko Kaneko, Kawasaki, Japan

[73] Assignee: Sony Corporation, Tokyo, Japan

[21] Appl. No.: 361,577

[22] Filed: Mar. 24, 1982

[30] Foreign Application Priority Data

Mar. 26, 1981 [JP] Japan ................................. 56-45232
Jul. 18, 1981 [JP] Japan ................................ 56-112513

[51] Int. Cl.$^4$ ...................... G11C 19/08; G11C 19/30
[52] U.S. Cl. ....................................... 365/10; 365/122
[58] Field of Search ..................... 365/10, 27, 28, 33, 365/122

[56] References Cited

U.S. PATENT DOCUMENTS 3,810,131  5/1974  Ashkin et al. ......................... 365/28
3,899,780  8/1975  Otala ....................................... 365/10

*Primary Examiner*—James W. Moffitt
*Attorney, Agent, or Firm*—Hill, Van Santen, Steadman & Simpson

[57] ABSTRACT

A thermomagnetic recording method is capable of recording information on a layer of soft magnetic material which has an axis of easy magnetization normal to the surface of the layer and in which magnetic bubble domains are generated by application of a bias magnetic field. Information is recorded by radiating the layer with pulses of a focused beam so as to form a magnetic bubble domain having a magnetization opposite to a direction of the bias magnetic field. Recorded information is stable but can be easily erased.

2 Claims, 12 Drawing Figures

TIME (μs)

TIME (μs)

THERMOMAGNETIC RECORDING METHOD

BACKGROUND OF THE INVENTION

1. Field of the Invention

The present invention relates to a thermomagnetic recording method. More specifically, the present invention relates to a thermomagnetic recording method which is easy to control and which allows stable recording of information by applying an external magnetic field to balance the forces acting on recorded bits, so that the recorded information may be kept stable even if the magnetic wall coercive force is very low or substantially zero.

2. Brief Description of the Prior Art

A bit recording method which records by focusing a laser beam is known as the conventional thermomagnetic recording method. The bit recording method includes the Curie temperature recording method and the temperature compensation point recording method. With these methods, bits can be formed when the laser beams are incident thereon. However, considering the various factors acting on the bits, the bits are unstable and recorded bits may disappear if the magnetic wall coercive force is low. Therefore, a high magnetic wall coercive force is required to retain the recorded bits as recorded information.

It has also been proposed to form fine bits in an amorphous GdCo thin film. However, bits recorded by this method are also reported to be unstable. It has, therefore, been proposed to vary the magnetic characteristics of the amorphous GdCo thin film in the direction of its thickness in order to stabilize the bits. Such techniques are reported in Appl. Phys. Lett. 32(10), pp. 673 to 675. This literature discloses a method for forming a thin film by continuously reducing the sputtering current and a method for forming a bilayered thin film. This literature reports that stable bit information was obtained with films obtained by this method when the temperature and external magnetic field were varied. This literature also reports that bits were stable even if an external magnetic field of 0 Oe or a relatively intense magnetic field such as 280 to 350 Oe was applied to an amorphous GdCo thin film prepared by this method. However, with an amorphous GdCo thin film, stable bit information cannot be held unless the film has a relatively high coercive force. Since the magnetic wall coercive force is relatively high and the film quality is not uniform, it is considered that formation of bits of uniform diameter is difficult. In order to form bits of uniform diameter, the output of the laser must be controlled, resulting in a complex structure of the laser.

The literature mentioned above also reports a case of an amorphous GdCo thin film formed under constant sputtering conditions. With this thin film, it is either impossible to form bits of small diameter or bits are extremely unstable against changes in the external magnetic field and temperature. Bits were formed by the temperature compensation point recording method in this case. The compensation temperature is only slightly higher than ambient temperature and is subject to abrupt changes with changes in the vicinity of ambient temperature. For this reason, temperature control within a limited range is necessary for the purpose of holding the recorded information.

It has also been proposed to record a large quantity of information on a ferromagnetic thin film of MnBi, Ti-substituted MnBi, and EuO by the Curie temperature recording method (IEEE Trans, Magn., Vol. MAG-13, May of 1977, pp. 982 to 988; Applied Optics, Vol. 13-4, pp. 770 to 777). According to this literature, MnBi is most preferable since the recording density is high and the angle of magnetic polarization is great. However, MnBi has a Curie temperature as high as 360° C. and requires more energy for recording. On the other hand, the decomposition temperature is as low as 450° C., providing only a slight difference from the Curie temperature. For this reason, it is difficult to control the output of the laser so that it may fall within the range of these two temperatures. Furthermore, an MnBi thin film has low weathering or weather resistance and is easily damaged by a humid atmosphere. MnBi has a coercive force of 1.5 kOe and requires a magnetic field of 700 Oe for erasing the information. Thus, a separate device is required to induce such a high magnetic field for erasing the recorded information. This adversely affects the size of the device.

It has also been proposed to use an Mn-Cu-Bi alloy having a low Curie temperature of 200° C. as a thermomagnetic recording medium (Ibid., IEEE Trans. Magn.) However, an Mn-Cu-Bi alloy has a coercive force as high as 1.5 kOe. Furthermore, with this alloy, the diameter of the bit varies with the output of the laser. In other words, the greater the pulse width of the laser beam, the greater the diameter of the bit. This results in degradation in recording sensitivity and impairs high-density recording.

It has also been proposed to record information at high density and with low power by the compensation temperature recording method using a thin film of $(BiGaLuSm)_3(FeAl)_5O_{12}$ on GGG (gallium garnet) substrate by the liquid phase epitaxial method (to be referred to as the LPE method hereinafter). This technique was proposed in Transactions of the Japan Society of Applied Magnetics, Nov. of 1980, 5aB-3. In this case, the output of the laser is similarly as high as 70 to 100 mW. Furthermore, cylindrical magnetic bubble domains have star shapes instead of circular shapes. This results in degraded readout sensitivity. The diameter of the bit is also too great which is not preferable. The coercive force of the thin film is not sufficiently low from a practical point of view.

OBJECTS AND SUMMARY OF THE INVENTION

It is, therefore, an object of the present invention to provide a thermomagnetic recording method which allows recording and readout of information independently of the output of a laser and without requiring a high coercive force.

Another object of the present invention is to provide a thermomagnetic recording method using a thin layer of soft magnetic material which has a low magnetic wall coercive force.

A further object of the present invention is to provide a thermomagnetic recording method which allows the diameter of the bit formed in the layer to be dependent only on the intensity of the bias magnetic field.

In order to achieve these objects, there is provided according to the present invention a thermomagnetic recording method comprising the steps of: forming a layer of soft magnetic material having an axis of easy magnetization normal to the surface of the layer and being a magnetic material of the type in which magnetic bubble domains can be generated; applying a bias magnetic field to the layer, an intensity of the magnetic field being selected between run out and collapse magnetic fields; and radiating a laser beam on the layer so as to form a magnetic bubble domain having a magnetization opposite to the direction of the bias magnetic field.

BRIEF DESCRIPTION OF THE DRAWINGS

The accompanying drawings show the preferred embodiments of the present invention in which.

DESCRIPTION OF THE INVENTION

Figure 1:
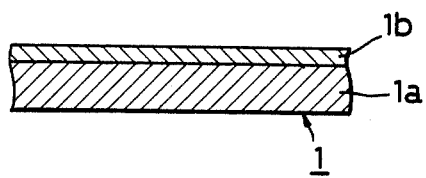
FIG. 1 is a schematic sectional view of a thermomagnetic recording medium used in a method according to the present invention.

A layer to be used for the method according to the present invention is made of a soft magnetic material which has a strong uniaxial magnetic anisotropy normal to the surface of the layer (axis of easy magnetization normal to the surface of the layer). An example of such a material is a YSmCaFeGe-type garnet such as (YSmCa)$_3$ or (FeGe)$_5$O$_{12}$. The magnetism of the thin layer must be determined such that the diameter of the bit formed in the layer is dependent only on the intensity of the bias magnetic field when this layer is used for the thermomagnetic recording medium. The magnetic wall coercive force of this layer must be below about 3 Oe and preferably below about 1 Oe. This layer of soft magnetic material is preferably formed by growing crystals of an YSmCaFeGe-type garnet by the LPE method on a crystalline substrate of a rare-earth gallium garnet such as nonmagnetic GGG.

Information can be recorded on the layer of soft magnetic material prepared in this manner by the following method. A bias magnetic field of predetermined intensity is applied to the layer of soft magnetic material. Then, the layer has uniaxial magnetic bubble domains and magnetization is normal to the surface of the layer over the entire surface of the layer. The layer is then radiated with pulses of a focused laser beam for recording information. Then, bits formed in this manner are magnetic bubble domains which have a predetermined diameter and which have a magnetization opposite to the direction of the bias magnetic field.

The intensity of the bias magnetic field to be applied to the layer of soft magnetic material for formation of the magnetic bubble domains varies depending upon the kind of soft magnetic material used for the layer. However, it suffices that the intensity falls within a range between a run out magnetic field H$_2$ and a collapse magnetic field H$_0$. This range is 57 to 73 Oe in the case of a (YSmCa)$_3$(FeGe)$_5$O$_{12}$ LPE layer. Since the coercive force, especially, the magnetic wall coercive force of the layer of soft magnetic material to be used for the method according to the present invention is extremely low, a bias magnetic field to be applied thereto may also be low. Therefore, a device for applying such a bias magnetic field can also be compact in size and may comprise, for example, a solenoid or a rubber magnet.

As has been described above, the layer with uniaxial magnetic bubble domains and a magnetization normal to the surface thereof is radiated with pulses of a focused laser beam. Then, a magnetic bubble domain having a predetermined diameter and a magnetization opposite to the direction of the bias magnetic field is formed, thereby recording bit information. The intensity of the incident laser beam and the pulse width thereof are not particularly limited since they do not affect the diameter of the bit. However, the intensity of the laser beam is generally within the range of 1 to 100 mW, and the pulse width is generally within the range of 1 to 100 μs. With a focused layer beam of the intensity and pulse width falling within these ranges, the shape of the formed bit may be made completely cylindrical. Recording of the bit information may be observed by Faraday effect as well as by Kerr effect, in accordance with the method of the present invention.

The bit information which is once recorded can be erased by applying a bias magnetic field exceeding the collapse magnetic field H$_0$. Since the collapse magnetic field of the layer of soft magnetic material of the present invention is extremely low, erasure of the bit information can be easily performed.

The signals recorded in the form of bits by the method described above can be reproduced or read out by the optomagnetic effect. According to an example of such method, an He-Ne layer beam radiated from a laser is linearly deflected by a deflector. The linearly deflected laser beam becomes incident on an objective lens through a beam splitter. The objective lens focuses the incident laser beam onto the layer of soft magnetic material on which signals are recorded. The beam reflected by a reflective film formed on the layer of soft magnetic material becomes incident on the objective lens. The laser beam is then deflected at a right angle by the beam splitter and then becomes incident on an analyzer. During this operation, the beam is subjected to Faraday rotation to the right or left in accordance with the direction of magnetization of the cylindrical magnetic bubble domains. In this manner, the beam output from the analyzer is pulse-duration-modulated in accordance with the pitch of the bits. The modulated signal thus obtained is supplied to a photoelectric transducer element such as a photodiode to be converted into an electric signal. The electric signal is supplied to an FM reproducing device for reproduction. The electric signal may alternatively be reproduced by coding at equal intervals.

The thermomagnetic recording method of the present invention will now be described in further detail with reference to the accompanying drawings.

FIG. 1 shows the structure of a thermomagnetic recording medium 1 consisting of a substrate 1a and a layer 1b of soft magnetic material formed thereon by the LPE method. The substrate 1a may be made of rare-earth gallium garnet. The layer 1b may be made of a magnetic bubble domain material such as a YSmCaFeGe-type garnet.

Figure 2:
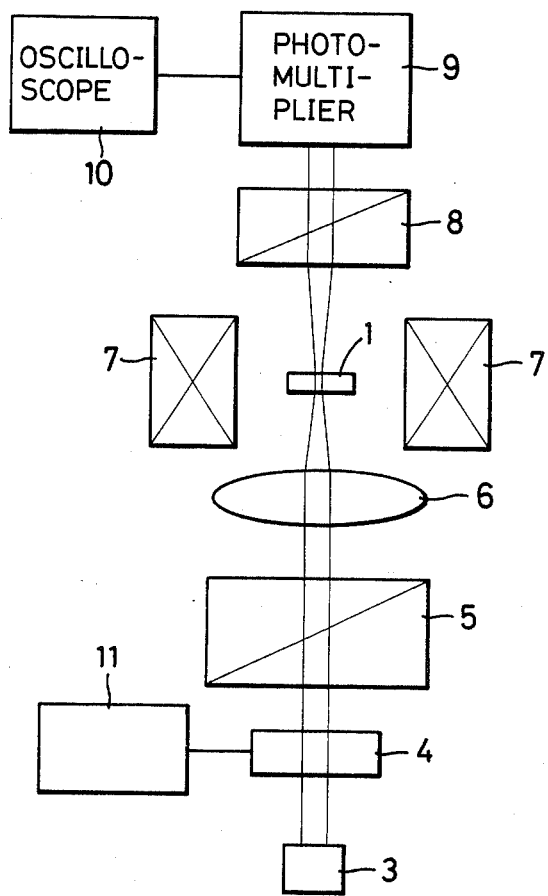
FIG. 2 is a block diagram of a unit for monitoring the formation of bits.

FIG. 2 shows a device for carrying out an experiment on recording or reproducing of signals on or from the recording medium 1.

Referring to FIG. 2, an argon laser of 488 nm wavelength, for example, emitted from a laser 3 becomes incident on an optical modulator 4 which converts the incident laser beam into pulses. The obtained pulses are linearly deflected by a deflector 5 and then focused on the recording medium 1 through a focusing lens 6. A bias coil 7 is arranged around the recording medium 1. The linearly modulated pulses passed through the recording medium 1 are rotated by the Farady effect and become incident on an analyzer 8. The output light from the analyzer 8 is supplied to a photoelectric multiplier 9, the output of which is monitored by an oscilloscope 10. The optical modulator 4 is driven by a pulse generated by a pulse generator 11.

EXAMPLE 1

A sample recoding medium 1 was prepared from a substrate 1a of $Gd_3Ga_3O_{12}$ and of a 0.5 mm thickness, and a thin layer 1b of $Y_{1.92}Sm_{0.1}Ca_{0.98}Fe_{4.02}Ge_{0.98}O_{12}$ and of a 5.8 μm thickness formed thereon by the LPE method. The sample recording medium 1 obtained was tested by the device shown in FIG. 2.

The thin layer 1b had a saturation magnetization 4 Ms of 142 G, a magnetic wall coercive force $H_{cw}$ of 0.5 Oe, a run out magnetic field $H_2$ of 57 Oe, and a collapse magnetic field $H_0$ of 73 Oe.

A current was supplied to the coil 7 to apply a bias magnetic field of 60 Oe on the recording medium 1. The minimum intensity of incident laser beam which allows recording on the recording medium 1 as a function of the pulse width of the laser beam was measured by varying the pulse width of the pulse output by the pulse generator 11.

Figure 3:
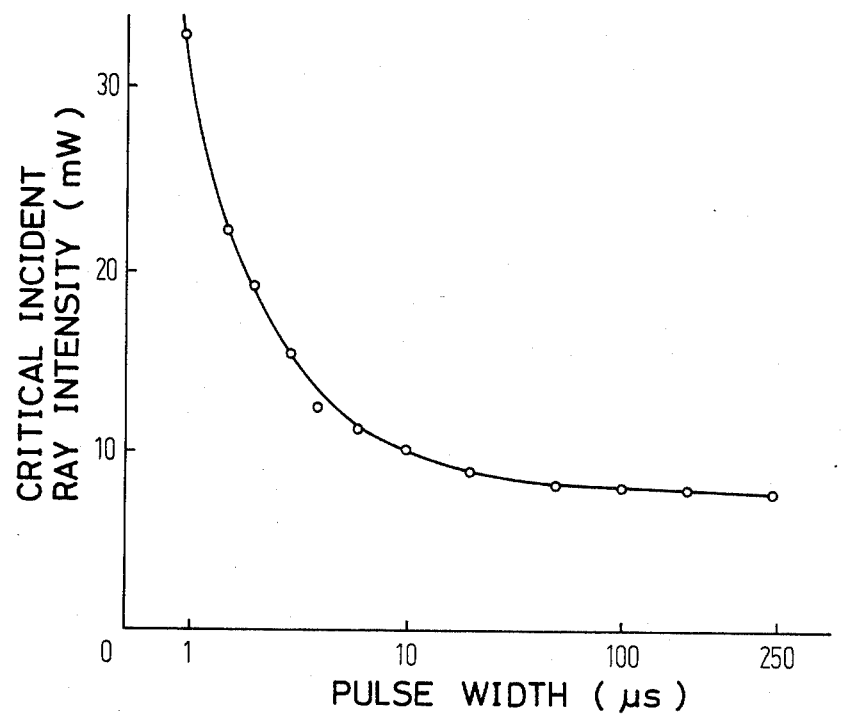
FIGS. 3, 5, 7 and 8 are graphs showing measurements and calculated values of various parameters.
Figure 4:
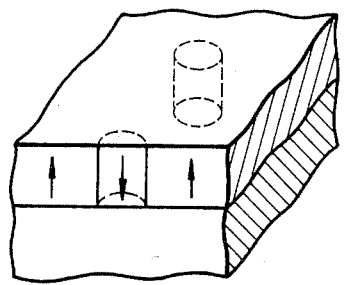
FIG. 4 is a model view of a recording medium for explanation of the recording method.

The results are shown in FIG. 3. In FIG. 3, the minimum intensity of the incident light (mW) is shown as a function of the pulse width w (μs). In this graph, the area above the curve represents the recording area. The shape of the bit formed under the conditions of the recording area is substantially completely cylindrical, as shown in FIG. 4. The diameter of the bit was 6 μm and the magnetization was opposite to the direction of the bias magnetic field. The diameter of the bit remained constant irrespective of changes in the intensity of the incident light and the pulse width. It was confirmed that the optimal thickness of the thin layer 1b is 0.5 to 2 times the bit diameter.

The diameter of the bit is determined by the balance of the opposite magnetic field acting on the bit, the bias magnetic field, and the force of the magnetic wall energy. Of these parameters, only the bias magnetic field is controllable. It has thus been found that the diameter of the bit depends only on the intensity of the bias magnetic field and can be obtained by the equation of Thiele (A. A. Thiele, Bell System Tech. J., 48, 3287 (1969)) if other necessary constants are given.

EXAMPLE 2

Figure 5:
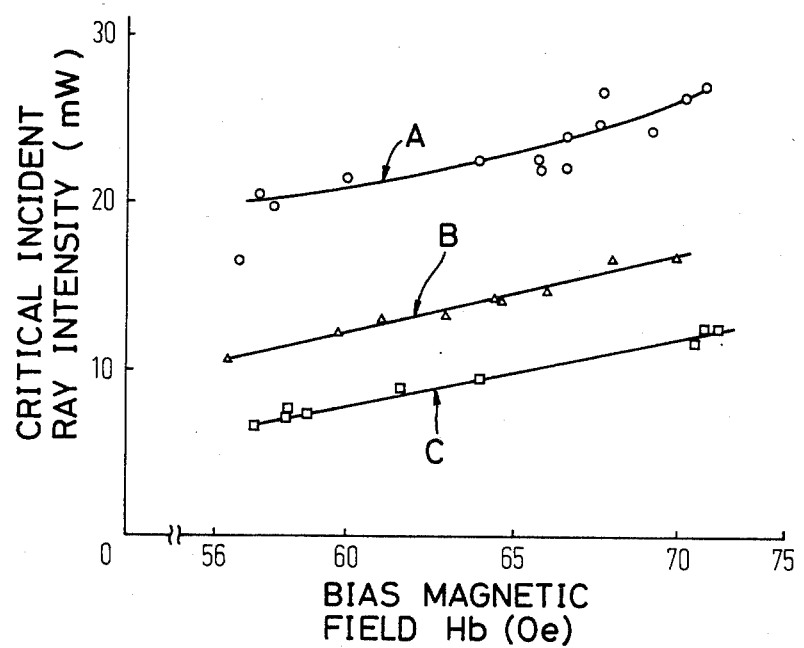

The minimum (critical) intensity of the incident light for recording was measured as a function of the bias magnetic field $H_b$ (Oe) utilizing the pulse width w as a parameter, with the same unit and conditions as those in Example 1. FIG. 5 shows the obtained results. In the graph of FIG. 5, a curve A represents a case wherein the pulse width w was 2 μs, a curve B represents a case wherein the pulse width w was 5 μs, and a curve C represents a case wherein the pulse width w was 20 μs. It is seen from these curves that the recording sensitivity increases monotonously with a decrease in the bias magnetic field. This may be associated with the fact that the energy of the recorded bit can be reduced by lowering the bias magnetic field.

It was expected that the stripe magnetic domain would be stabler than the cylindrical magnetic domain if the bias magnetic field is lower than the run out magnetic field $H_2 = 57$ Oe. In Example 2, the formation of the stripe magnetic domain was observed as expected. In order to erase the bit, it was necessary to apply a magnetic field exceeding the collapse magnetic field $H_{col} = 73.0$ Oe.

EXAMPLE 3

The formation of the cylindrical magnetic domain was monitored using the similar sample as tested in Examples 1 and 2. The device used was basically the same as that shown in FIG. 2 except that two-step staircase pulse to be described later was supplied to the optical modulator 4 from the pulse generator 11.

The bit was formed by application of a bias magnetic field of 58 Oe with an argon laser beam of 488 mm wavelength. The analyzer 8 was controlled by continuous radiation of a weak focused beam such that the output of the photoelectric multiplier 9 was strong where the bit was formed but was at the minimum where the bit was not formed. The optical modulator 4 produced two-step staircase light pulses having waveforms shown at the lower parts of FIGS. 6A and 6B. The pulse of higher level was used as a recording pulse, while the pulse of lower level was used as a readout pulse. The output of the photoelectric multiplier 9 thus obtained was monitored by the oscilloscope 10. The waveforms obtained by the oscilloscope 10 are shown at the upper parts of FIGS. 6A and 6B.

Figure 6A:
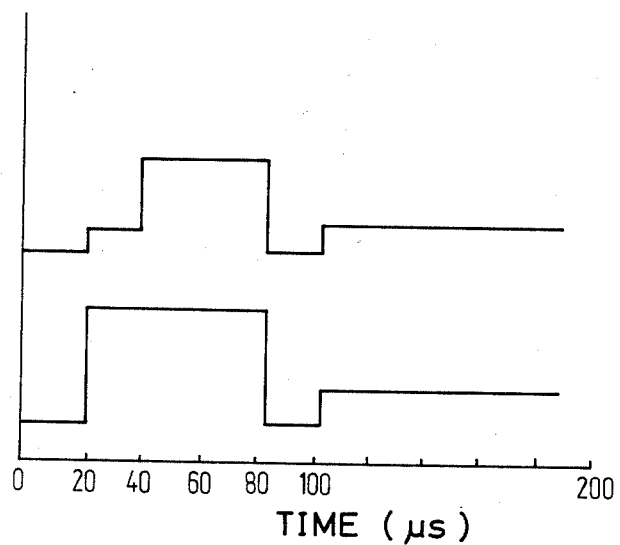
FIGS. 6A and 6B show waveforms obtained by an oscilloscope for monitoring the formation of bits.

In FIG. 6A, at 20 μs after application of a recording pulse of 7.1 mW, the output of the photoelectric multiplier 9 increases in a stepped manner. It is considered that the cylindrical magnetic bubble domain was generated after 40 μs. The formation of the cylindrical magnetic bubble domain, that is, recording of a bit may be observed through monitoring the output of the photoelectric multiplier as a great contrast ratio.

Figure 6B:
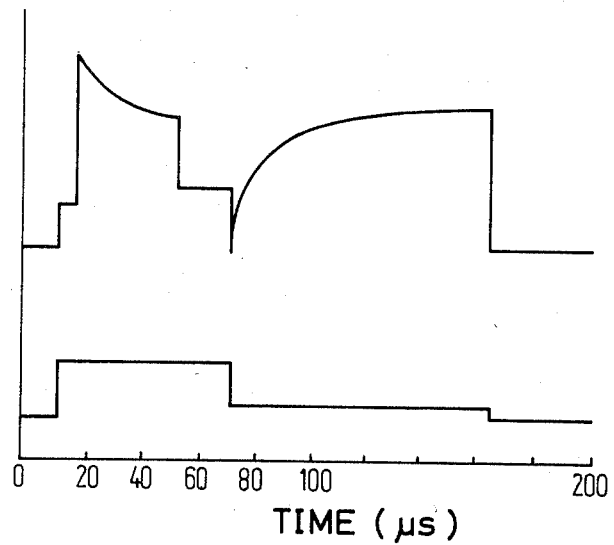

In the case of FIG. 6B, the intensity of the incident light for recording was 16 mW which was higher than that of FIG. 6A. About 10 μs after the radiation of the laser beam, the cylindrical magnetic bubble domain was generated and the output increased in a stepped manner. The output then gradually decreased. This is considered to be attributable to a temperature rise in the cylindrical magnetic bubble domain and the resultant decrease in the Faraday rotation angle. About 40 μs after application of the recording pulse, the output decreased in a stepped manner. This is considered to be attributable to the fact that the temperature in the vicinity of the cylindrical magnetic bubble domain is higher than the Curie temperature. From this, it is concluded that the cylindrical magnetic domain is generated before the temperature reaches the Curie temperature. Therefore, the recording sensitivity of the method of the present invention is higher than the sensitivity of the Curie temperature recording method.

When the duration of the recording pulse (90 μs) is terminated, the readout pulse is applied next. Since the readout pulse is weaker than the recording pulse, the temperature of the sample gradually decreases and the output of the multiplier gradually increases. In the example, the output settled to be constant about 30 μs after the recording pulse. It is considered that the temperature reached an equilibrium for the readout pulse at this point.

EXAMPLE 4

Figure 7:
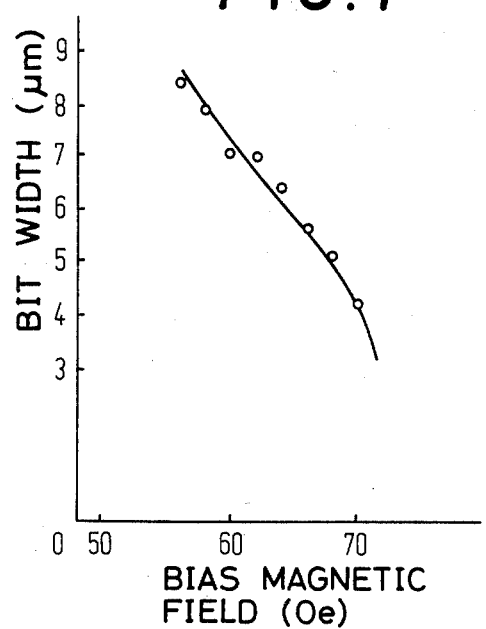
Figure 8:
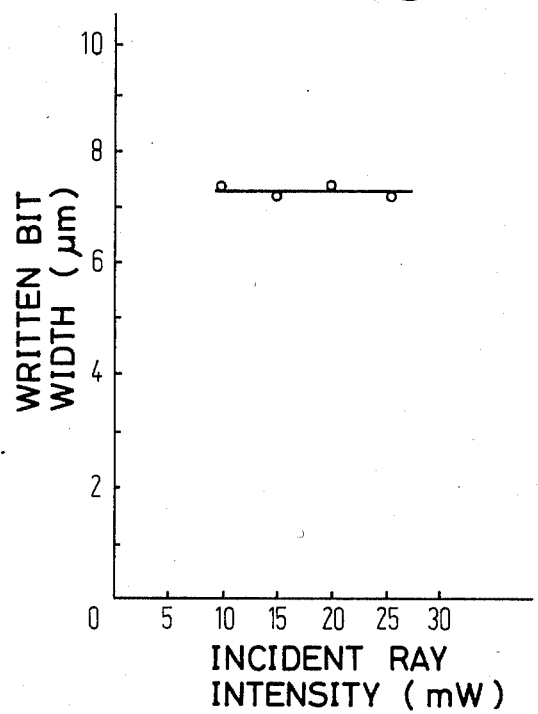

The dependence of the diameter of the bit on the bias magnetic field and the intensity of the incident light was examined for the same sample as in Examples 1 to 3. FIGS. 7 and 8 show the obtained results.

The graph of FIG. 7 shows the change in the diameter d ($\mu$m) of the bit when the bias magnetic field was varied, the intensity of the incident light was 22 mW and the pulse width was 10 $\mu$s. In this graph, the curve represents the bit diameter d obtained by the equation of Thiele. Measurements (indicated by blank circles) are in the vicinity of the curve. This indicates that the bit diameter may be controlled by the bias magnetic field $H_b$(Oe).

The graph of FIG. 8 shows the bit diameter d ($\mu$m) when the intensity of the incident light P (mW) was varied, the bias magnetic field was 60 Oe and the pulse width was 10 $\mu$s. It is seen from this graph that the bit diameter does not change even if the intensity of the incident light is changed within the range of 10 to 25 mW. This indicates that the bit diameter does not depend upon the intensity of the incident light.

If recording is performed by changing the radiating position of the pulse-duration-modulated laser beam relative to the recording medium with the device of FIG. 2, and the focusing position of a continuous laser beam of weaker intensity relative to the recording medium is changed thereafter, the same pulse signal as that recorded by the photoelectric multiplier 9 can be obtained. However, with this device, since the light transmitted through the recording medium 1 is utilized, it is difficult to design a unit for changing the position of the laser beam relative to the recording medium 1.

Figure 9:
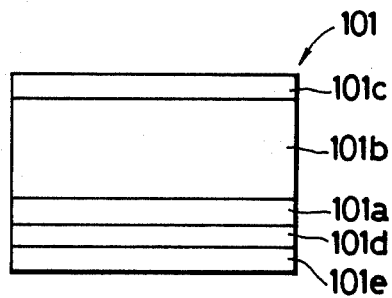
FIG. 9 is a sectional view showing another thermomagnetic recording medium.
Figure 10:
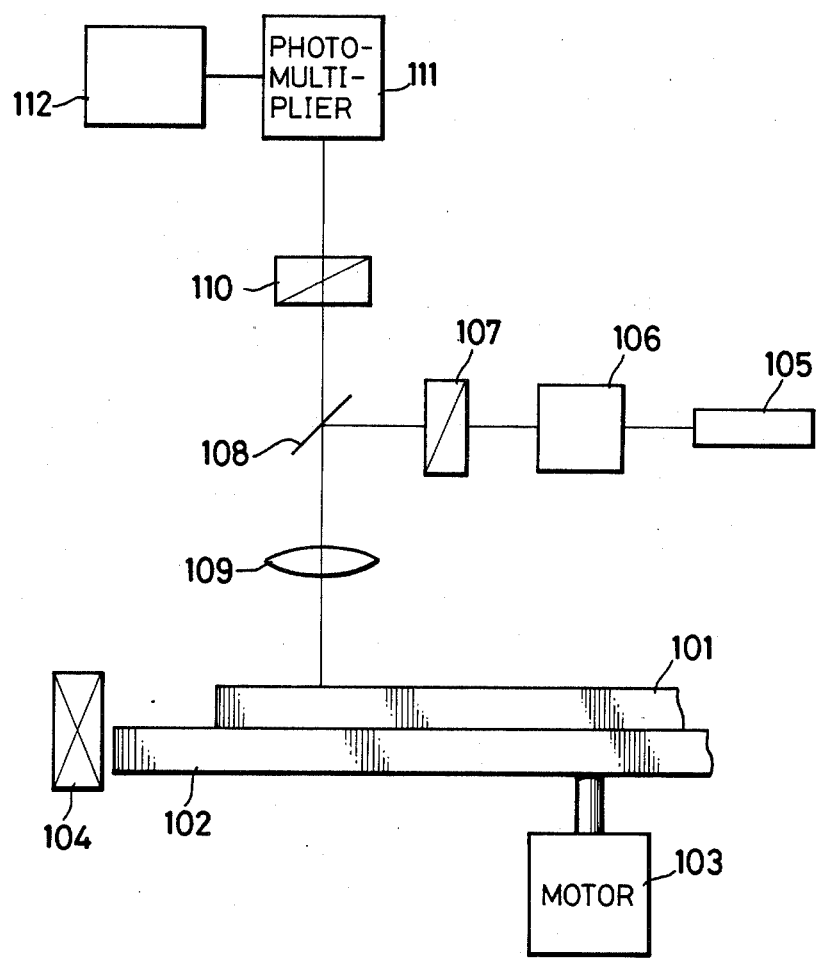
FIG. 10 is a block diagram of a recording/reproducing device.

FIGS. 9 and 10 respectively show a recording medium 101 suitable for recording and reproduction of signals and a unit for changing the position of the laser beam relative to the recording medium 101. The recording medium 101 is obtained by first growing a magnetic thin film 101a of $(YSmCa)_5(FeGe)_5O_{12}$ garnet on a crystalline substrate 101b of rare-earth gallium garnet. A non-reflective coating layer 101c is formed on the other surface of the substrate 101b. Over the magnetic thin film 101a are formed, in the order named, a reflective film 101d, for example, an aluminum deposited film of 0.3 $\mu$m thickness and a protective film 101e, for example, a silicon dioxide film of 0.5 $\mu$m thickness. The recording medium 101 of this structure is detachably placed on a bias unit 102 such as a permanent magnet, as shown in FIG. 2, so that the bias magnetic field constantly acts on the recording medium 101. The recording medium 101 is rotated by a motor 103. An auxiliary bias coil 104 is also arranged around the unit 102 so that the bias magnetic field may be intensified. An argon laser beam of 488 mm wavelength emitted by a laser 105 is radiated on an optical modulator 106 which produces light pulses. These pulses are focused by a focusing lens 109 through a deflector 107 and a half mirror 108 for recording. The unit was moved in one direction at a constant speed to achieve a bit pitch of about 25 $\mu$m, with the intensity of the incident light pn being 15 mW, the pulse width being 50 $\mu$s, the frequency being 2 Hz, and the bias magnetic field being 60 Oe. Readout of the bit information recorded on the recording medium 101 in this manner can be performed by supplying the light reflected by the reflective film 101a to the analyzer 110, and then to a photomultiplier or photoelectric multiplier 111, the output of which is obtained through an amplifier 112.

As has been described above, in order to erase the bit information recorded in this manner, the recording medium is radiated with a continuous laser beam of 15 mW in the opposite direction to the recording direction so as to slightly overlap the bits to be erased. However, the direction of shift of the sample in readout is opposite to the recording direction only for the purpose of ease in operation; it may be the same as the recording direction.

Figure 11:
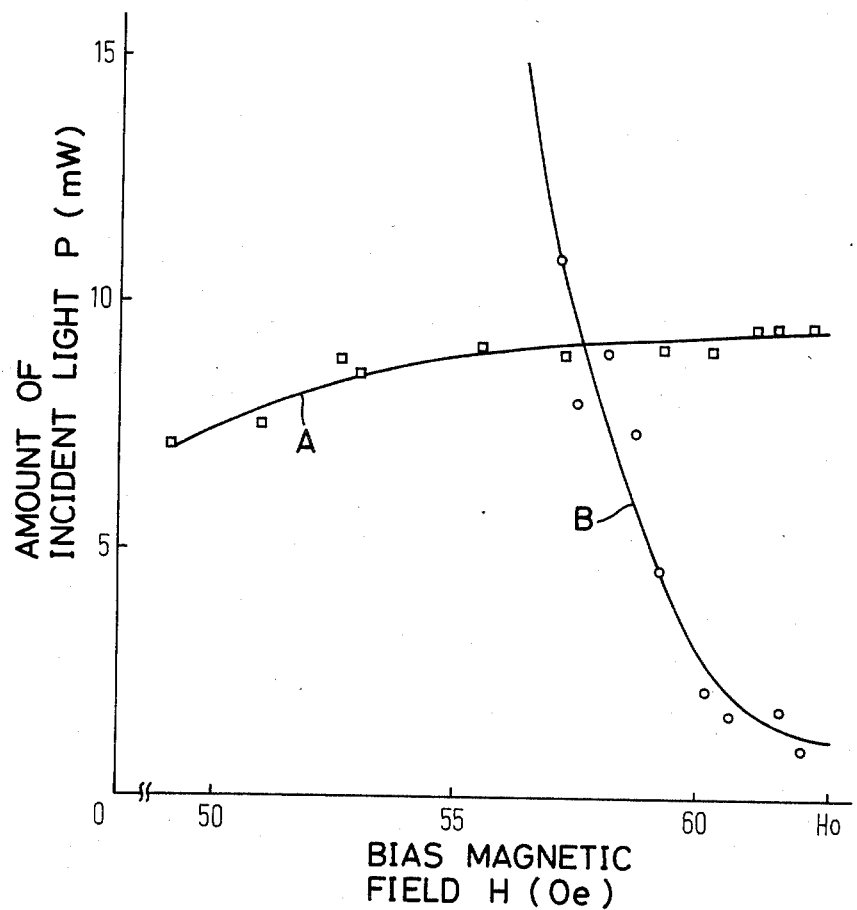
FIG. 11 is a graph showing a recording area and an erasing area.

Recording and readout were performed with the recording medium and unit as described above while varying the intensity of the incident light and the bias magnetic field. FIG. 11 shows the obtained results. In the graph of FIG. 11, a curve A is a critical curve for recording. In other words, recording can be performed under the conditions of the area above the curve A. A curve B is an erasure critical curve. The area to the right of the curve B is the erasing area. It is seen from this that the signals can be easily erased by varying the intensity of the incident light and the bias magnetic field. Readout of the signals can, on the other hand, be performed in the area to the left of the curve B and below the curve A.

The thermomagnetic recording method of the present invention has the following advantages:

The thin layer of soft magnetic material of the present invention need only have a magnetic wall coercive force below a predetermined value such as 2 or 3 Oe, and may have an irregular crystal structure. Therefore, the formation of the thin layer is easy.

As the magnetic wall coercive force is small, a generally low magnetic field need only be applied to erase the recorded information. Since the shape of the bit is substantially completely cylindrical, the readout sensitivity is good.

The bit diameter is not dependent on the output of the laser, so that it may be easily controlled by varying the bias magnetic field. Therefore, correction after recording which has hitherto been impossible due to too great a coercive force may be performed by the method of the present invention.

The thin layer of the present invention does not have a particular point such as the temperature compensation point near ambient temperature. For example, since the Curie temperature of the thin layer is about 200° C., the information can be stably held against changes in wide range of the temperature.

What is claimed is:

1. A thermomagnetic recording method which comprises:
    providing a layer of soft magnetic material in which a magnetic bubble domain can be stored, said layer having an easy axis of magnetization normal to a major surface of said layer, and being magnetized along one direction by the application of an external bias magnetic field,
    irradiating said layer with a light beam having a power larger than a critical writing power to form a magnetic bubble domain in said layer in a direction opposite to said one direction while applying a bias magnetic field of a strength between the collapse magnetic field and the run out magnetic field of said layer, but smaller than a critical erasing magnetic field, and selectively erasing said magnetic bubble domain by irradiating said magnetic bubble domain with a light beam having a power smaller than said critical writing power while applying a bias magnetic field larger than said critical erasing magnetic field and smaller than said collapse magnetic field, said writing and erasing being performed solely by control of said light beam power and bias magnetic field.

2. A thermomagnetic recording method which comprises:

providing a layer of soft magnetic material in which a magnetic bubble domain can be stored, said layer having an easy axis of magnetization normal to a major surface of said layer and being magnetized along one direction by the application of an external bias magnetic field, irradiating said layer with a light beam having a power sufficient to nucleate said magnetic bubble domain while applying a bias magnetic field of a strength between the collapse magnetic field and the run out magnetic field of the layer and having a predetermined intensity, and selectively erasing said magnetic bubble domain by irradiating said magnetic bubble domain with said light beam with the application of a bias magnetic field larger than said predetermined intensity, said writing and erasing being performed solely by control of said light beam power and bias magnetic field.

* * * * *